(12) United States Patent
Leipold et al.

(10) Patent No.: US 8,389,868 B2
(45) Date of Patent: Mar. 5, 2013

(54) PACKAGED INTEGRATED CIRCUITS HAVING INDUCTORS AND METHODS TO FORM INDUCTORS IN PACKAGED INTEGRATED CIRCUITS

(75) Inventors: Dirk Leipold, Igis (CH); Chih-Ming Hung, McKinney, TX (US); David W. Evans, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 326 days.

(21) Appl. No.: 11/967,879

(22) Filed: Dec. 31, 2007
(Under 37 CFR 1.47)

(65) Prior Publication Data
US 2009/0168387 A1 Jul. 2, 2009

(51) Int. Cl.
*H05K 1/16* (2006.01)
(52) U.S. Cl. .................................. 174/260; 361/764
(58) Field of Classification Search .............. 174/260, 174/520, 521; 361/760–765; 257/787
See application file for complete search history.

(56) References Cited

U.S. PATENT DOCUMENTS

| | | | | |
|---|---|---|---|---|
| 5,592,025 | A * | 1/1997 | Clark et al. | 257/774 |
| 6,194,774 | B1 * | 2/2001 | Cheon | 257/531 |
| 6,972,480 | B2 * | 12/2005 | Zilber et al. | 257/678 |
| 7,227,240 | B2 * | 6/2007 | Knapp et al. | 257/531 |
| 2001/0015497 | A1 * | 8/2001 | Zhao et al. | 257/738 |
| 2003/0005569 | A1 * | 1/2003 | Hiatt et al. | 29/602.1 |
| 2005/0122198 | A1 * | 6/2005 | Zhou et al. | 336/200 |
| 2005/0236689 | A1 * | 10/2005 | Sugiura et al. | 257/531 |
| 2007/0215994 | A1 * | 9/2007 | Beauchamp et al. | 257/676 |
| 2009/0273428 | A1 * | 11/2009 | Chen | 336/200 |
| 2009/0289374 | A1 * | 11/2009 | Aoki | 257/773 |

* cited by examiner

*Primary Examiner* — Yuriy Semenenko
(74) *Attorney, Agent, or Firm* — Ronald O. Neerings; Wade James Brady, III; Frederick J. Telecky, Jr.

(57) ABSTRACT

Packaged integrated circuits having inductors and methods to form inductors in packaged integrated circuits are disclosed. An example method comprises forming a substrate having a first trace and a contact, attaching an integrated circuit to the substrate over the first trace, and electrically coupling the first trace to the contact via an electrical conductor that extends over the integrated circuit to form the inductor in the packaged integrated circuit.

30 Claims, 10 Drawing Sheets

US 8,389,868 B2

PACKAGED INTEGRATED CIRCUITS HAVING INDUCTORS AND METHODS TO FORM INDUCTORS IN PACKAGED INTEGRATED CIRCUITS

FIELD OF THE DISCLOSURE

The present disclosure generally relates to packaged integrated circuits and, more particularly, to packaged integrated circuits having inductors and methods to form inductors in packaged integrated circuits.

BACKGROUND

To satisfy consumer desire for more portable electronic devices, semiconductor manufacturers desire to incorporate as many devices as possible at the integrated circuit level to reduce the amount of circuit board area needed. It is not often possible to incorporate certain devices such as high power resistors, large capacitors, or large inductors into an integrated circuit. Similarly, there is often not enough space within an integrated circuit package due to the large number of bond wires and traces that route signals to and from the integrated circuit.

Devices that cannot be incorporated into the integrated circuit and/or the integrated circuit package are attached to a circuit board, thereby consuming valuable circuit board area and increasing the total cost of manufacturing, for example, a portable electronic device incorporating the integrated circuit(s) and the circuit board.

Figure 1:
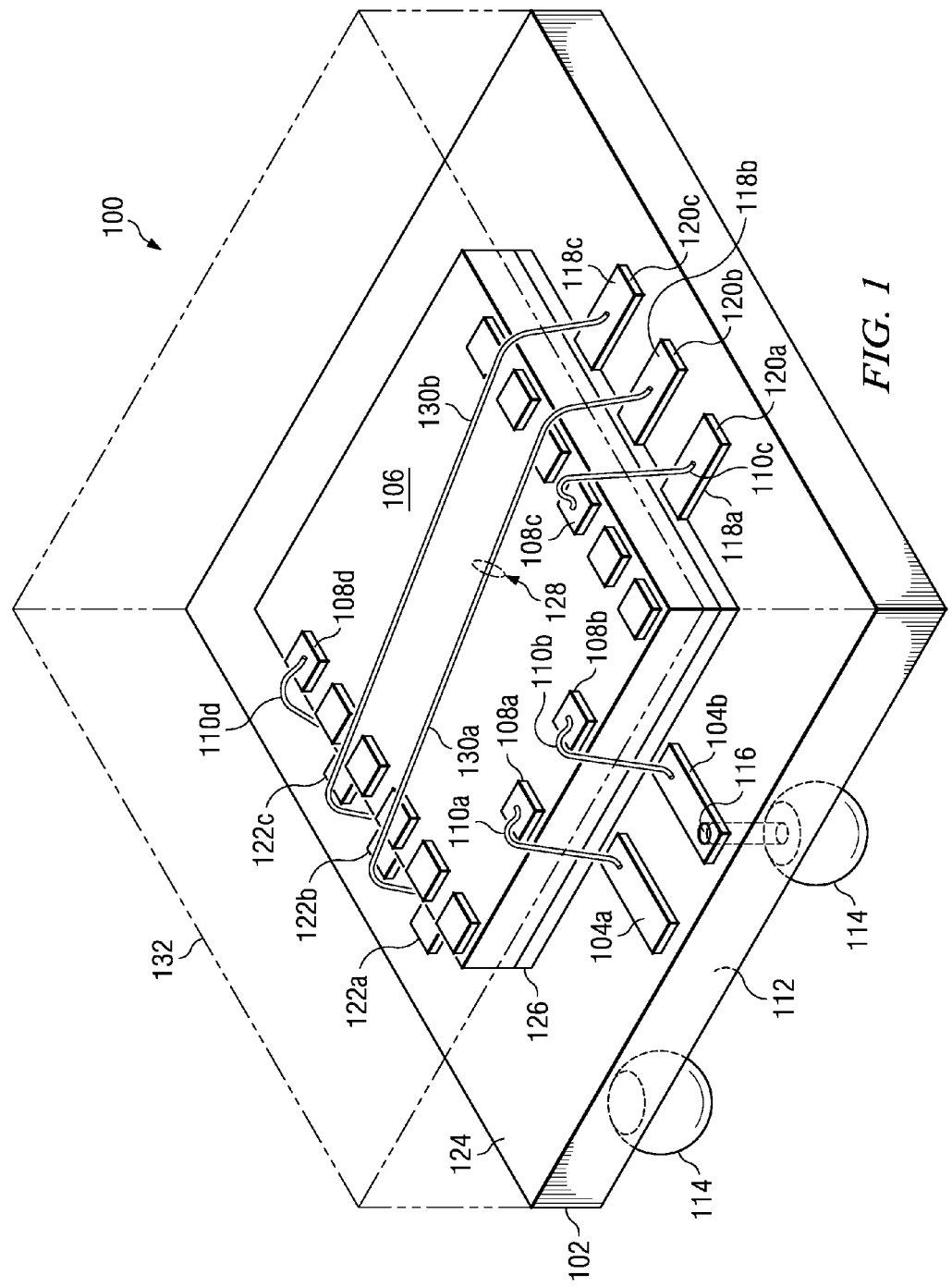
FIG. 1 illustrates an example packaged integrated circuit having an example inductor.

To clarify multiple layers and regions, the thicknesses of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is over the other part with one or more intermediate part(s) located therebetween. Stating that any part is in contact with another part means that there is no intermediate part between the two parts.

DETAILED DESCRIPTION

Packaged integrated circuits having inductors and methods to form inductors in packaged integrated circuits are described herein. As described herein, an integrated circuit is a die or a chip containing at least one active semiconductor device (e.g., an NPN transistor, etc.). Thus, for example, an integrated circuit may contain a single active device (e.g., a transistor) or the integrated circuit may contain multiple active devices (e.g., a processor having millions of transistors).

Figure 2:
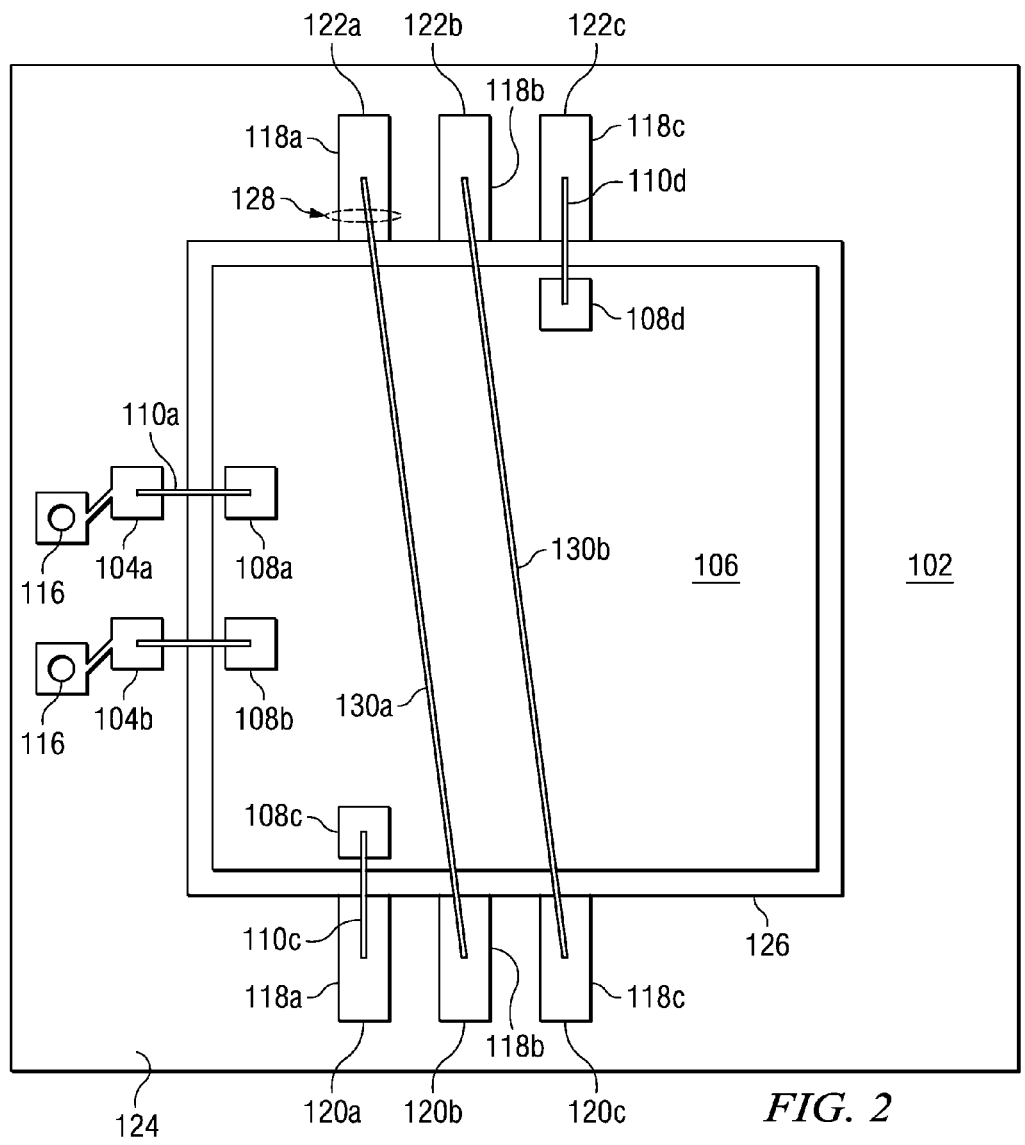
FIG. 2 is a top view of the example packaged integrated circuit of FIG. 1.

FIGS. 1 and 2 illustrate an example packaged integrated circuit 100 having an example inductor contained therein. In the examples of FIGS. 1 and 2, a substrate 102 having one or more pads 104*a-b* (e.g., metal traces, polysilicon, etc.) to receive an example integrated circuit 106. In some examples, the integrated circuit 106 includes one or more contacts 108*a-d* disposed on its surface to receive one or more bond wires 110*a-d*. In some cases, as illustrated in the example of FIG. 1, due to the number of contacts 108, a bottom surface 112 of the substrate 102 provides one or more conductive elements 114 in a grid array arrangement.

In the illustrated example, the conductive elements 114 are provided to facilitate electrical and mechanical attachment of the example packaged integrated circuit 100 to a circuit board (not shown). Thus, as clearly shown in FIG. 1, the pads 104 are provided to electrically couple at least some of the contacts 108 to the conductive elements 114. In particular, to electrically couple the pads 104*a-b* to the conductive elements 114, vias, an example of which is depicted at reference numeral 116, may be disposed within the substrate 102 and electrically coupled between the pads 104*a-b* and the conductive elements 114.

The example of FIGS. 1 and 2 also includes pads or traces 118*a-c*, which are included to facilitate the formation of an example inductor as described in greater detail below. The traces 118*a-c* have respective first ends 120*a-c* and second ends 122*a-c*. In the example of FIG. 1, the traces 118*a-c* are not coupled to vias. However, in other examples, the traces 118*a-c* may be in electrical contact with vias to electrically couple the traces 118*a-c* to one or more conductive elements 114.

The example integrated circuit 106 is attached to a surface 124 of the substrate 102 by any suitable process (e.g., die attach, etc.). In the example of FIGS. 1 and 2, an adhesive 126 is applied to the substrate 102 and the integrated circuit 106 is placed over the adhesive 126. The adhesive 126 may be disposed over the traces 118*a-c* to encapsulate at least a portion of the traces 118*a-c*. In the illustrated example, the first ends 120*a-c* and the second ends 122*a-c* of the traces 118*a-c* are exposed. To couple the contacts 108*a-b* to the conductive elements 114, the bond wires 110*a-b* are placed between the corresponding contacts 108*a-b* and the pads 104*a-b*.

In the example of FIG. 1, the bond wire 110*c* is placed between the contact 108*c* and the first end 120*a* of the trace 118*a*. To form an inductor 128 around the example integrated circuit 106, a bond wire 130*a* is placed between the second end 122*a* of the trace 118*a* and the first end 120*b* of the trace 118*b*. In the illustrated example, the bond wire 130*a* extends across and over the example integrated circuit 106 without substantially contacting it and electrically couples the trace 118*a* to the trace 118*b*. In some examples, the bond wire 130*a* extends across and over the example integrated circuit 106 without electrically coupling the bond wire 130a to other devices and/or circuits of the integrated circuit 106. Similarly, another bond wire 130b is placed between the second end 122b of the trace 118b and the first end 120c of the trace 118c. Additionally, the bond wire 110d electrically couples the second end 122c of the trace 118c to the contact 108d of the integrated circuit 106. The contents disposed over the surface 124 of the substrate 102 are encapsulated in a rigid material such as a mold compound 132 (e.g., an epoxy resin), thereby securing the contents of the packaged integrated circuit 100 in rigid material to protect its contents from the environment.

In this configuration, the bond wires 130a-b and the traces 118a-c form the inductor 128 such that it wraps or loops around the integrated circuit 106 and the bond wires 110c-d electrically couple the inductor 128 to the integrated circuit 106. Though the example of FIG. 1 illustrates an inductor having two turns or loops around the integrated circuit 106, more or fewer turns may be used to implement the inductor 128. As a result, the inductor 128 may be implemented directly in the packaged integrated circuit 100. In other examples, the integrated circuit 106 may be coupled to the traces 118a-c by any suitable means such as, for example, a through-chip via. In such examples, the traces 118a-c may be partially and/or completely disposed within the adhesive 126. Alternatively or additionally, the traces 118a-c may be electrically coupled to the conductive elements 114.

The inductor 128 may be implemented for any suitable purpose within the packaged integrated circuit 100. For example, the inductor 128 may be coupled in series with an output of the integrated circuit 106 to implement an impedance matching network. In such examples, the inductor 128 is electrically coupled to one or more of the conductive elements 114 to electrically couple the inductor 128 to an example circuit board. In the illustrated examples of FIGS. 1 and 2, the inductor 128 is electrically coupled to the contacts 108c and 108d of the integrated circuit 106 to, for example, block noise (e.g., switching noise, etc.).

In some examples, the inductance of the inductor 128 may be calculated by approximating a solenoid using the bond wires 130a-b and the traces 118a-c. Typically, the inductance of a solenoid is given by Equation 1 below.

$$L = \mu_0 \mu_R N^2 \frac{A}{l} \quad \text{[Equation 1]}$$

where L is the inductance in Henrys, N is the number of turns (or loops) of the solenoid, $\mu_0$ is the permeability of free space, $\mu_R$ is the relative permeability of the medium within the turns of the inductor 128, A is the area of the medium within the turns, and l is the total length of the electrical conductor (i.e., the bond wires 130a-b and the traces 118a-c, etc.) that implements the solenoid.

In solenoids, a mutual inductance between the turns of the solenoid typically increases its overall inductance. Similarly, the bond wires 130a-b and the traces 118a-c provide a similar mutual inductance that affects the inductance of the inductor 128. As a result, the inductance of the inductor 128 may be controlled based on the design of the traces 118a-c and the bond wires 130a-b. However, in such examples, the inductance given by Equation 1 is an approximation. A more accurate computation of the inductance may be achieved by analysis of the inductor 128 using Maxwell's equations via, for example, a finite element analysis simulator.

In some examples, the inductance of the inductor 128 is used to compute the quality factor, which is the energy stored in the inductor 128 divided by the power loss (i.e., the resistance of the bond wires 130a-b and the traces 118a-c). Thus, the quality factor is described by Equation 2 below.

$$Q = \frac{|X|}{R} = \frac{2\pi f L}{R} \quad \text{[Equation 2]}$$

In Equation 2, X is the reactance of the inductor 128 at a particular frequency, R is the resistance of the inductor 128, L is the inductance of the inductor 128, and f is the frequency at which the quality factor is to be calculated. In the example of FIGS. 1 and 2, the resistances of the traces 118a-c and the bond wires 130a-b are substantially constant over a change in frequency (e.g., 50 milliohms per millimeter of length). In other examples, at high frequencies (e.g., 2 gigahertz), the resistance of the inductor 128 is frequency dependent due to the skin effect.

As a result, an electrical model of the inductor 128 may be calculated so that the inductor 128 may be properly designed within the packaged integrated circuit 100. In the examples of FIGS. 1 and 2, the inductance of the inductor 128 is based on the size of the packaged integrated circuit 100. For example, in packages having a size of 10 millimeters wide by 10 millimeters long, the inductance of the inductor 128 is typically within the range of fractions of nanohenrys (e.g., 0.1 nH) to several microhenrys (e.g., 50 µH). Inductors having values in the nanohenry and microhenry range are typically provided via thin-film coils on a circuit board, which consume significant circuit board area and incur additional costs. In addition, such thin-film coils are significantly more expensive than the bond wires 130a-b and the traces 118a-c that form the inductor 128.

Figure 3:
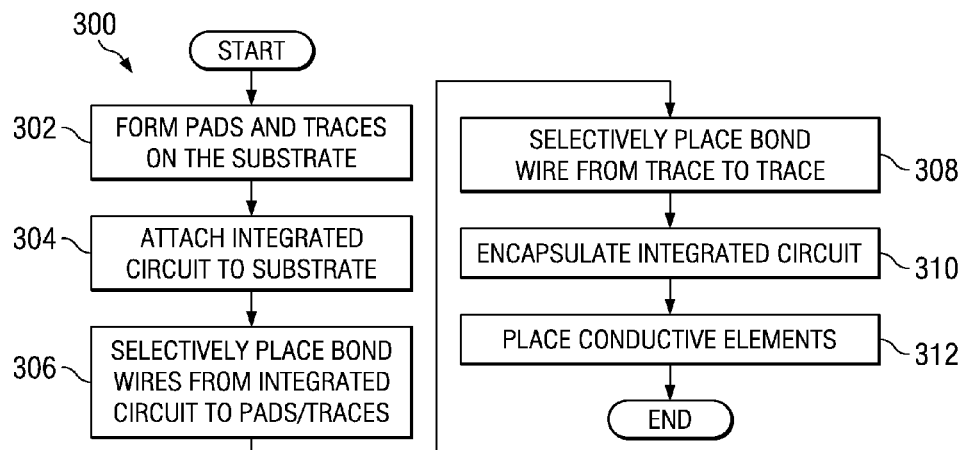
FIG. 3 is a flow chart of an example process to form the example inductor of FIG. 1.
Figure 4A:
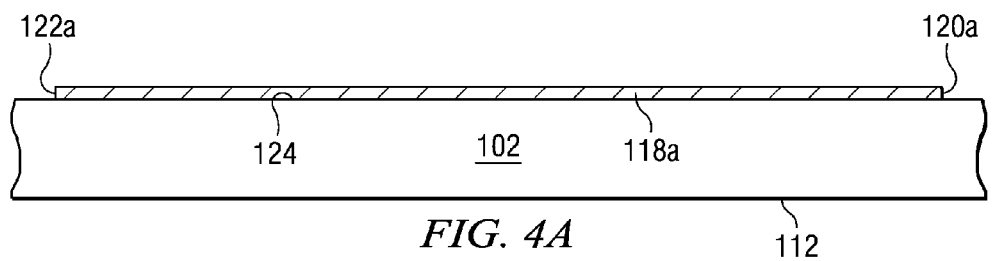
FIGS. 4A-4F illustrate an example integrated circuit at different stages of the example process of FIG. 3.

FIG. 3 illustrates an example process 300 to form the example packaged integrated circuit 100. The example process 300 is explained in conjunction with FIGS. 4A-4F, which illustrate the example packaged integrated circuit 100 at different stages of the example process 300. Initially, in the example of FIG. 4A, the example process 300 begins by forming the pads 104 and the traces 118 on the substrate 102 (block 302). The substrate 102 is implemented by any suitable material such as, for example, a dielectric material (e.g., a polyimide, etc.) and a metal layer attached to a surface of the dielectric material. In such examples, a suitable process selectively removes the metal layer to form the pads 104 and the traces 118 on the surface 124 of the substrate 102. However, in other examples, the traces 118 may be implemented in any other suitable location such as, for example, in the substrate 102 (i.e., between the surfaces 112 and 124 of the substrate 102).

Figure 4B:
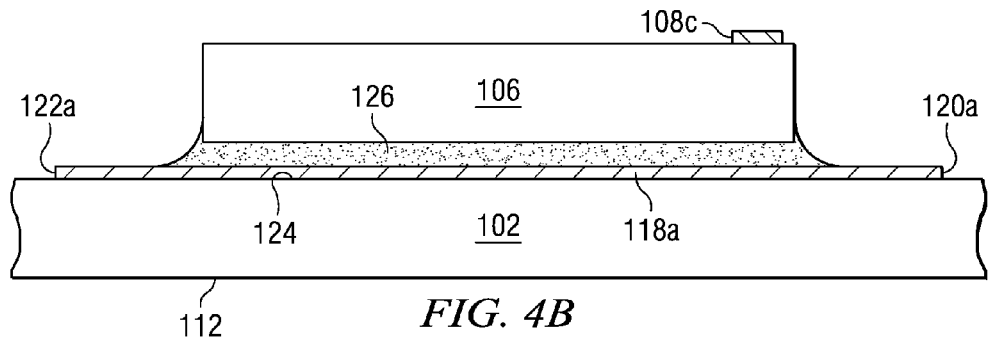
Figure 4C:
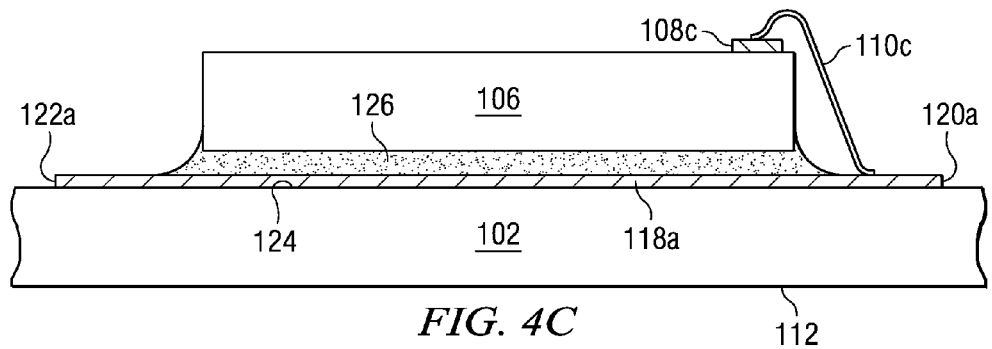

After forming the pads 104 and the traces 118, the integrated circuit 106 is attached to the substrate 102 via any suitable process (e.g., die bond, etc.) (block 304). In the example of FIG. 4B, an adhesive 126 (e.g., an epoxy, etc.) is placed on the substrate 102 so that the integrated circuit 106 does not contact the pads 104 or the traces 118. After attaching the integrated circuit 106, the bond wires 110 are placed between the contacts 108 and their respective pads 104 and/or traces 118 (block 306). As illustrated in the example of FIG. 4C, the bond wires 110 are implemented by any suitable material (e.g., gold, aluminum, copper, etc.) and are placed by any suitable bond type (e.g., stitch bond, wedge bond, etc.).

Figure 4D:
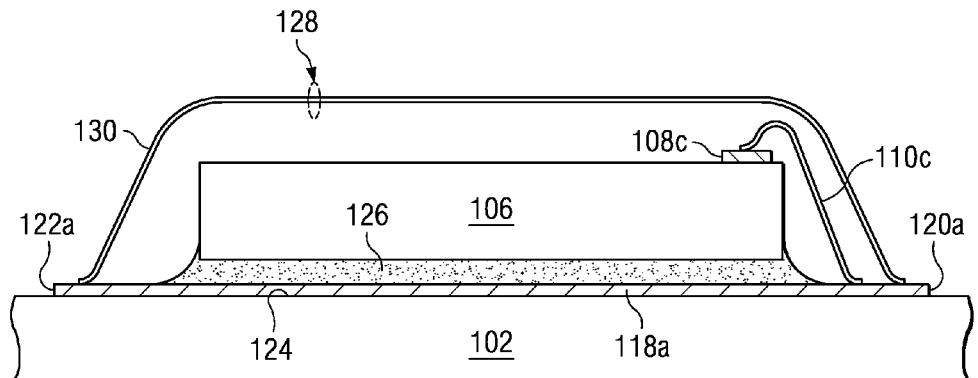

Referring to the example of FIG. 4D, the bond wires 130a-b are then selectively placed between the traces 118a-c (block 308). As described above, the bond wire 130a is placed from the second end 122a of the trace 118a to the first end 120*b* of the trace 118*b*. The bond wire 130*b* is placed from the second end 122*b* of the trace 118*b* to the first end 120*c* of the trace 118*c*. In the example of FIG. 1, the bond wires 130*a-b* extend across and over the integrated circuit 106 such that the bond wires 130*a-b* are not in electrical contact with the integrated circuit 106. As described above, the bond wires 130*a-b* and the traces 118*a-c* form the inductor 128. In the example of FIG. 4D, the bond wires 130*a-b* are implemented by any suitable material (e.g., copper, aluminum, etc.) and are placed via any suitable bond type. In particular, the bond wires 130*a-b* may be implemented by a different material than the bond wires 110 due to the length of the bond wires 130*a-b*.

In other examples, the bond wires 130 are selectively placed between the traces 118 during the example process 300 to control the inductance value of the inductor 128. In the example of FIG. 4D, the bond wires 130 couple the neighboring traces 118*a-c*. However, in other examples, the bond wires 130 may skip, for example, the trace 118*b* to alter the inductance of the inductor 128 during manufacturing. For example, the inductance of the inductor 128 may be modified based on an input impedance of the integrated circuit 106, which changes due factors that affect semiconductor processes (e.g., temperature, humidity, process changes, etc.).

Figure 4E:
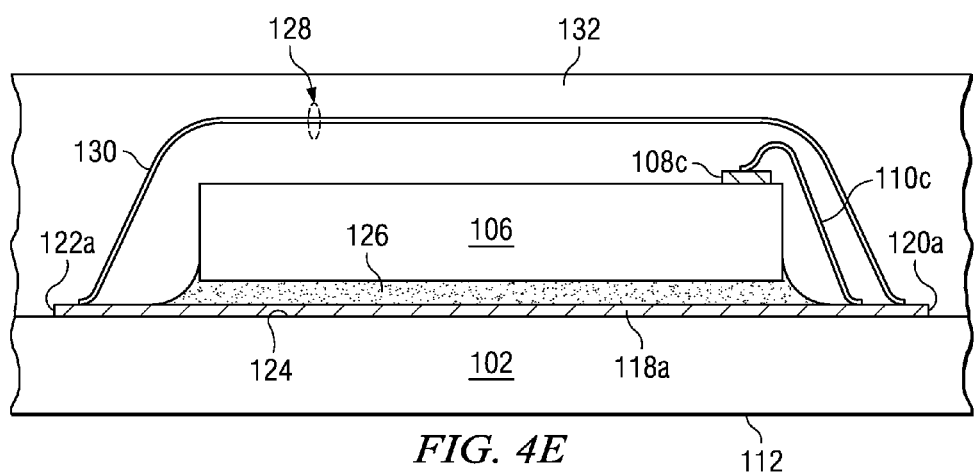
Figure 4F:
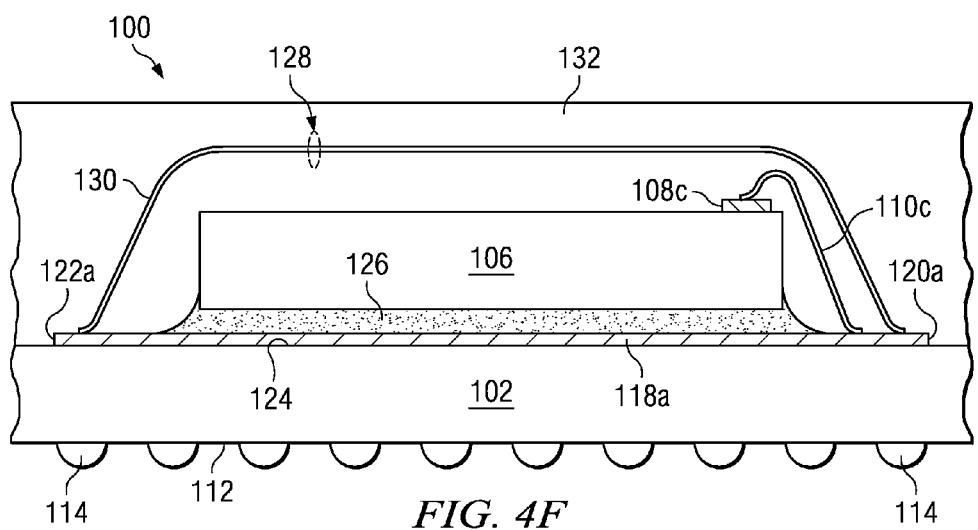

After placing the bond wires 130*a-b*, the integrated circuit 106 and bond wires 110 and 130 are encapsulated in a mold compound 132 for their protection (block 310). In the example of FIG. 4E, a transfer molding process forms the mold compound 132 over the surface 124 of the substrate 102, thereby securing and protecting the contents of the packaged integrated circuit 100 from the environment. After forming the mold compound 132 in the example process 300, the conductive elements 114 are formed on the bottom surface 112 of the substrate 102. In the example of FIG. 4F, the conductive elements 114 are placed in electrical contact with the vias and are thereby electrically coupled to the contacts 108 of the integrated circuit 106 (block 312). The conductive elements 114 may be implemented by any suitable material (e.g., solder, gold bumps, etc.) and are placed by any suitable process (e.g., solder reflow, screen printing, etc.). After placing the conductive elements 114, the example process 300 ends.

Although the foregoing describes a particular sequence of operations, the sequence of operations of the example process 300 may vary. For example, the stages of the process may be rearranged, combined, or divided. Alternatively or additionally, additional stages, processes, or operations may be added. In some examples, stages of the process may be removed. For example, the packaged integrated circuit 100 may be a flip-chip integrated circuit that does not require bond wires to electrically couple the integrated circuit 106 to the pads 104. Alternatively or additionally, some or all of the materials described may be changed.

Figure 5:
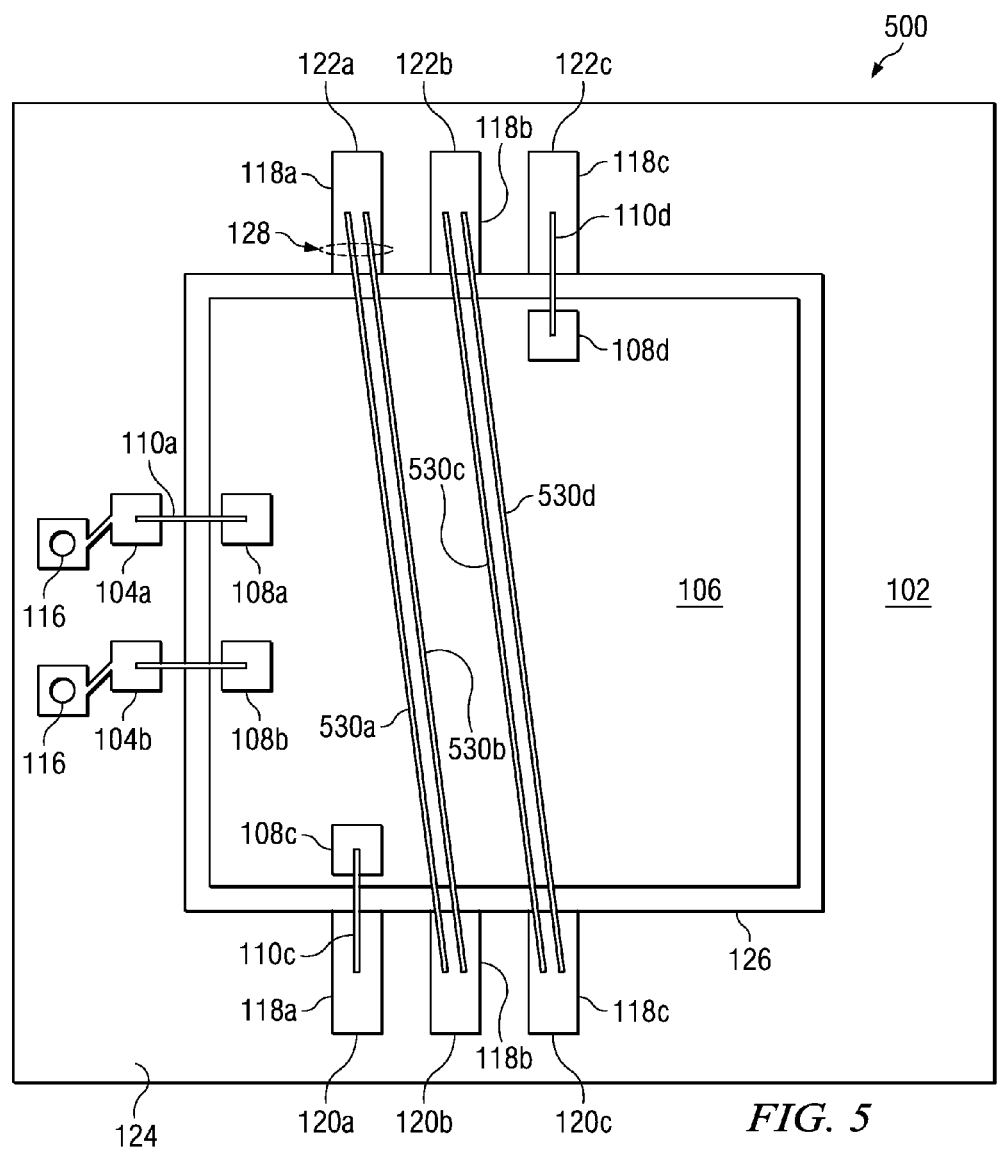
FIG. 5 illustrates another example packaged integrated circuit having an example inductor.

FIG. 5 illustrates another example packaged integrated circuit 500 having bond wires 530*a-d*. In the example of FIG. 5, the bond wires 530*a* and 530*b* are placed between the second end 122*a* of the trace 118*a* and the first end 120*b* of the trace 118*b*. Similarly, bond wires 530*c* and 530*d* are placed between the second end 122*b* of the trace 118*b* and the first end 120*c* of the trace 118*c*. In the illustrated example, the bond wires 530*a-b* and 530*c-d* are placed in parallel pairs to reduce the parasitics (e.g., resistance, etc.) of the inductor 128.

Figure 6:
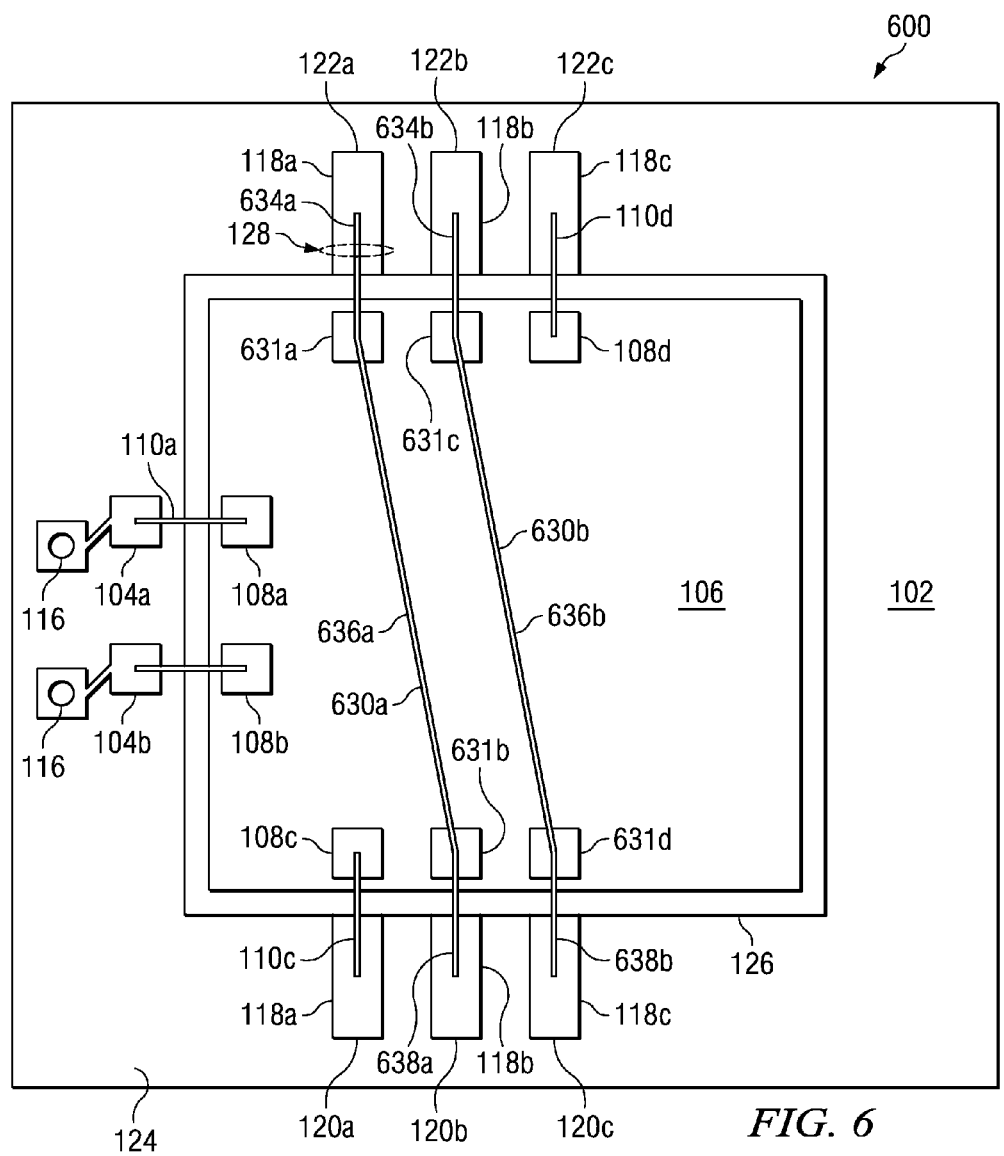
FIG. 6 illustrates yet another example packaged integrated circuit having an example inductor.

FIG. 6 illustrates another example packaged integrated circuit 600. In the example of FIG. 6, the bond wires 630*a-b* are coupled to contacts 631*a-d* of the integrated circuit 106. In the example of FIG. 6, the contacts 631*a-d* are not electrically coupled to devices and/or circuits of the integrated circuit 106 (i.e., the contacts 631*a-d* are floating). In the illustrated example, the bond wires 630*a-b* include first portions 634*a-b*, second portions 636*a-b*, and third portions 638*a-b*. The first portion 634*a* couples the second end 122*a* of the trace 118*a* to the contact 631*a*, the second portion 636*a* couples the contact 631*a* to the contact 631*b*, and the third portion 638*a* couples the contact 631*b* to the first end 120*b* of the trace 118*b*. The bond wire 630*b* is coupled to the contacts 631*c-d* in the same way that the bond wire 630*a* is coupled to the contacts 631*a-b*. In the illustrated example, the bond wires 630*a-b* extend across and over the integrated circuit 106 via the contacts 631*a-d*, which are floating, without electrically coupling the bond wires 630*a-b* to the devices and/or circuits of the integrated circuit 106. Because the contacts 631*a-d* are floating, the bond wires 630*a-b* are coupled to the integrated circuit 106 via the traces 118*a* and 118*c*. In other examples, the contacts 631*a-d* may be electrically coupled to devices and/or circuits of the integrated circuit 106.

In the example of FIG. 6, the bond wires 630*a-b* are attached to the intervening contacts 631*a-d* to improve manufacturability. Generally, the diameters of the bond wires 110 and 630 are very small (e.g., 25.4 microns). As a result, the bond wires 110, 630 are malleable and susceptible to damage during manufacturing. In particular, shapes of the bond wires 110 and 630 are difficult to control and often the desired shape may not be attainable. As a result, long bond wires such as the bond wires 630 easily bend and deform during manufacturing, which may cause electrical and/or reliability failure of the packaged integrated circuit 600. In the illustrated example, the bond wires 630*a-b* are coupled to the intervening contacts 631*a-d* to provide structural support to prevent the bond wires 630*a-b* from substantially deforming, thereby preventing the bond wires 630*a-b* from contacting any of the bond wires 110 and/or other electrical contacts 108 of the integrated circuit 106.

Figure 7:
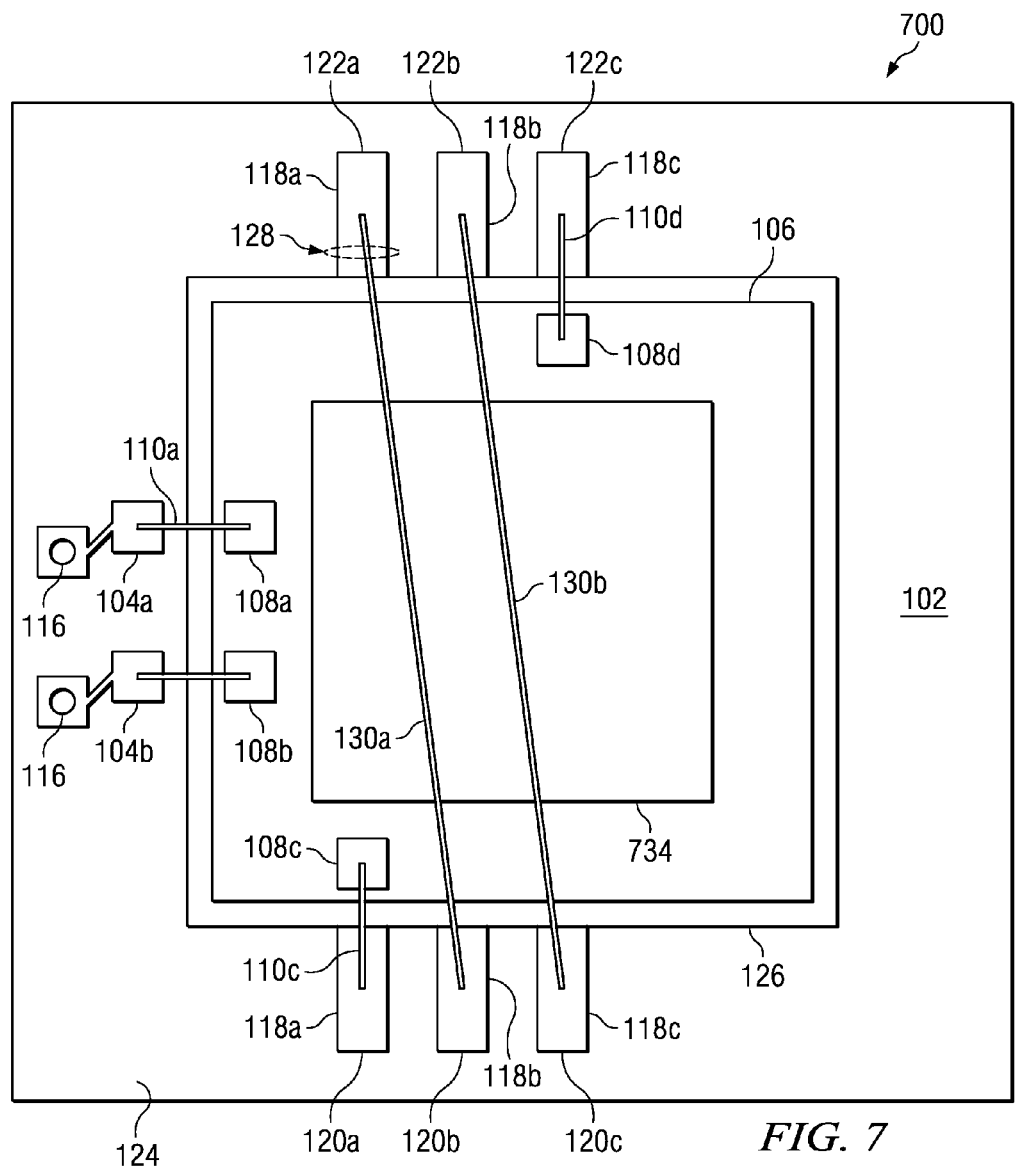
FIG. 7 illustrates another example packaged integrated circuit having an example inductor.

FIG. 7 illustrates yet another example packaged integrated circuit 700. In the example of FIG. 7, a spacer layer 734 is disposed over the integrated circuit 106. Generally, the spacer layer 734 is an electrical insulator that covers and electrically insulates a portion of the integrated circuit 106 while exposing the contacts 108 of the integrated circuit 106 to receive the bond wires 110. In the example of FIG. 7, the spacer layer 734 is implemented to prevent the bond wires 130 from electrically coupling the inductor 128 to integrated circuit 106. In addition, because the spacer layer 734 is an electrical insulator the bond wires 730 can contact the spacer layer 734 for structural support, thereby improving the manufacturability of the packaged integrated circuit 700.

Figure 8:
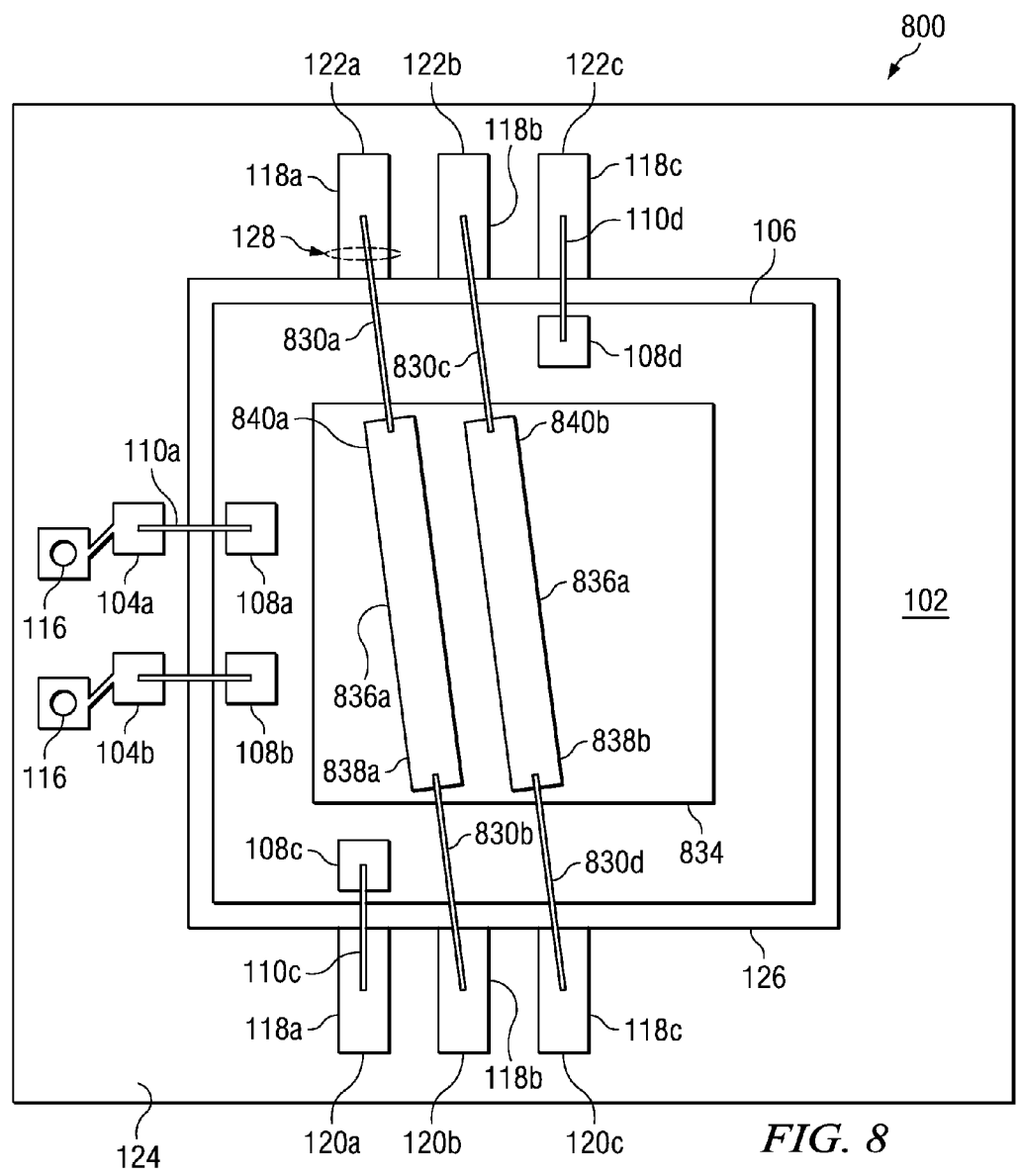
FIG. 8 illustrates yet another example packaged integrated circuit having an example inductor.

FIG. 8 illustrates yet another example packaged integrated circuit 800 having another example spacer layer 834. In the example of FIG. 8, the spacer layer 834 includes traces 836*a-b* having respective first ends 838*a-b* and second ends 840*a-b*. In the example of FIG. 8, a bond wire 830*a* is coupled from the second end 122*a* of the trace 118*a* to the second end 840*a* of the trace 836*a*. The first end 838*a* of the trace 836*a* is coupled to the first end 120*b* of the trace 118*b* via a bond wire 830*b*. In other words, the bond wires 830*a-b* and the trace 836*a* of the spacer layer 734 electrically couple the trace 118*a* to the trace 118*b*. Similarly, bond wires 830*c-d* and the trace 836*b* electrically couple the second end 122*b* of the trace 118*b* to the first end 120*c* of the trace 118*c*.

Figure 9:
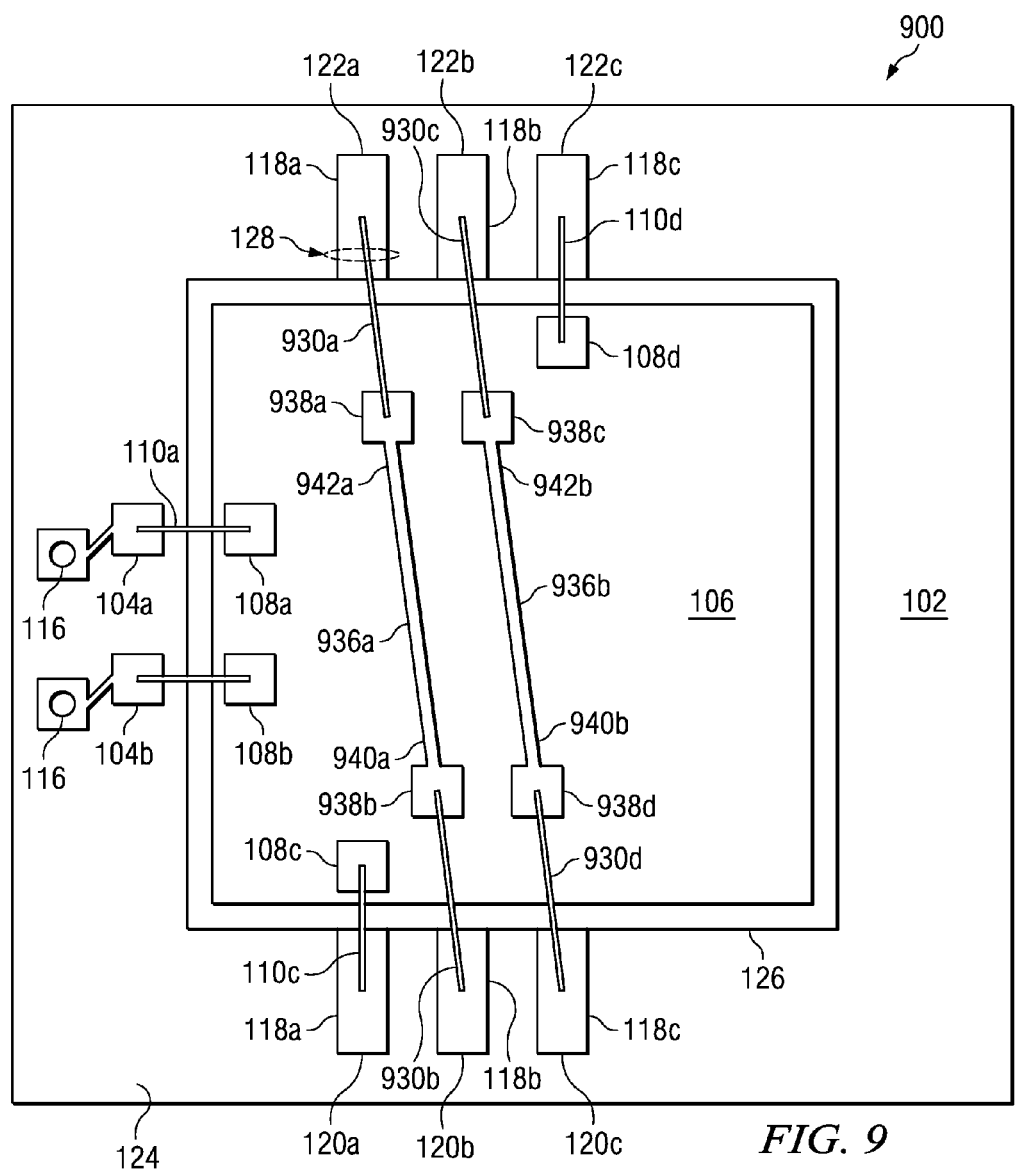
FIG. 9 illustrates yet another example packaged integrated circuit having an example inductor.

FIG. 9 illustrates another example packaged integrated circuit 900 having traces 936*a-b* formed on the integrated circuit 106. In the illustrated example, the traces 936*a-b* include contacts 938*a-d* at respective first ends 940*a-b* and second ends 942*a-b*. In such an example, the traces 936*a-b* includes the contacts 938*a-d* to receive bond wires 930*a-d* that electrically couple the traces 936a-b to the traces 118a-c. In the illustrated example, the bond wire 930a is coupled from the second end 122a of the trace 118a to the contact 938a. Similarly, the bond wire 930b is coupled from the first end 120b of the trace 118b to the contact 938b at the first end 940a of the trace 936a. That is, the bond wires 930a-b and the trace 936a of the integrated circuit 106 electrically couple the trace 118a to the trace 118b. Similarly, bond wires 930c-d and the trace 936b electrically couple the second end 122b of the trace 118b to the first end 120c of the trace 118c. In the illustrated example, the traces 936a-b on the integrated circuit 106 are not electrically coupled to devices and/or circuits of the integrated circuit 106. However, in other examples, the traces 936a-b and/or the contacts 938a-d may be electrically coupled to the devices and/or circuits of the integrated circuit 106.

Figure 10:
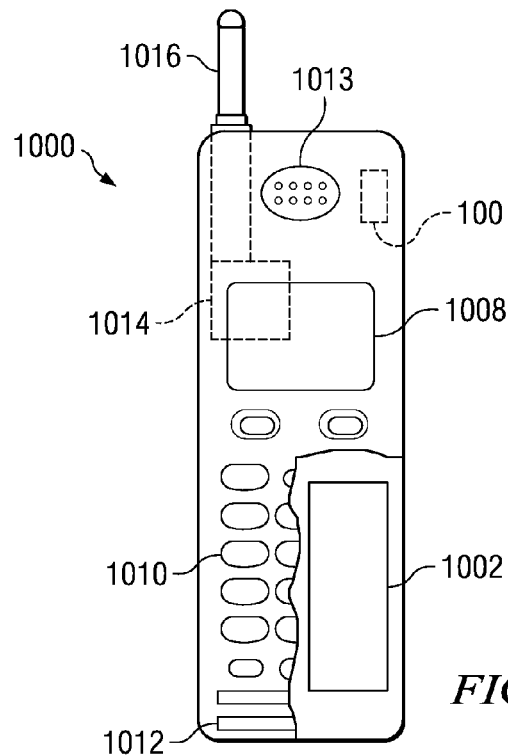
FIG. 10 illustrates an example communications device that may be implemented using the example integrated circuit of FIG. 1, 5, 6, 7, 8, or 9.

FIG. 10 illustrates the example packaged integrated circuit 100 of FIG. 1, 5, 6, 7, 8, or 9 in an example environment of use, namely, in an example wireless communication device 1000. The example wireless communication device 1000 may be a mobile telephone (e.g., a cell phone, a wireless messaging device, etc.), a pager, a laptop computer, a wireless game device, a digital audio player, etc. The example wireless communication device 1000 includes a processor 1002, a packaged integrated circuit 1003, which may be any of the example packaged integrated circuits described herein, a display 1008, an interface 1010 (e.g., buttons, a touch screen, etc.), and a microphone 1012, all of which may be communicatively coupled to the example processor 1002. In the illustrated example, the wireless communication device 1000 includes a speaker 1013 that is communicatively coupled to the example processor 1002. The example wireless communication device 1000 also includes a wireless communication transceiver 1014 that is communicatively coupled to an antenna 1016. In the example of FIG. 10, the packaged integrated circuit 1003 may implement any suitable device associated with the operation of the wireless communication device 1000 (e.g., an amplifier, a transceiver, a processor, a power regulator, a phase lock loop, etc.).

Figure 11:
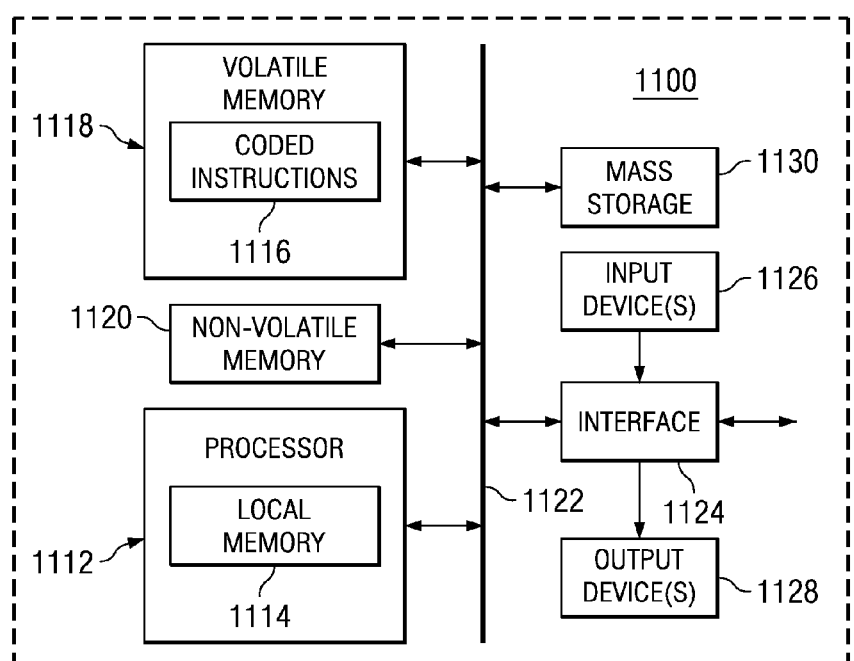
FIG. 11 is a block diagram of an example computer that may be used to implement the example integrated circuit of FIG. 1, 5, 6, 7, 8, or 9.

FIG. 11 is a block diagram of another example system 1100 capable of implementing the apparatus and methods disclosed herein. The system 1100 can be, for example, a server, a personal computer, a personal digital assistant (PDA), an Internet appliance, a DVD player, a CD player, a digital video recorder, a personal video recorder, a set top box, or any other type of computing device.

The system 1100 of the instant example includes a processor 1112 such as a general purpose programmable processor. The processor 1112 includes a local memory 1114, and executes coded instructions 1116 present in the local memory 1114 and/or in another memory device. The processor 1112 may execute, among other things, machine readable instructions. The processor 1112 may be any type of processing unit, such as one or more microprocessors from the Texas Instruments OMAP® family of microprocessors. Of course, other processors from other families are also appropriate.

The processor 1112 is in communication with a main memory including a volatile memory 1118 and a non-volatile memory 1120 via a bus 1122. The volatile memory 1118 may be implemented by Static Random Access Memory (SRAM), Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1120 may be implemented by flash memory and/or any other desired type of memory device. Access to the main memory 1118, 1120 is typically controlled by a memory controller (not shown).

The system 1100 also includes an interface circuit 1124. The interface circuit 1124 may be implemented by any type of interface standard, such as an Ethernet interface, a universal serial bus (USB), and/or a third generation input/output (3GIO) interface. One or more input devices 1126 are connected to the interface circuit 1124. The input device(s) 1126 permit a user to enter data and commands into the processor 1112. The input device(s) can be implemented by, for example, a keyboard, a mouse, a touchscreen, a track-pad, a trackball, an isopoint and/or a voice recognition system.

One or more output devices 1128 are also connected to the interface circuit 1124. The output devices 1128 can be implemented, for example, by display devices (e.g., a liquid crystal display, a cathode ray tube display (CRT)), by a printer and/or by speakers. The interface circuit 1124, thus, typically includes a graphics driver card.

The interface circuit 1124 also includes a communication device such as a modem or network interface card to facilitate exchange of data with external computers via a network (e.g., an Ethernet connection, a digital subscriber line (DSL), a telephone line, coaxial cable, a cellular telephone system, etc.).

The system 1100 also includes one or more mass storage devices 1130 for storing software and data. Examples of such mass storage devices 1130 include floppy disk drives, hard drive disks, compact disk drives and digital versatile disk (DVD) drives. In such examples, the packaged integrated circuit 100 of FIG. 1 may be incorporated into any suitable device of the system 1100. For example, the packaged integrated circuit 100 may be implemented in the processor 1112, the non-volatile memory 1120, the mass storage device 1130, and so forth.

Packaged integrated circuits having inductors contained therein and methods of forming the same have been disclosed. In the examples provided, an inductor has been formed in the packaged integrated circuit by wrapping an electrical conductor (e.g., metal traces and bond wires) around the integrated circuit. As a result of integrating the inductor into the package, the packaged integrated circuit saves significant circuit board area. In addition, the materials and steps to form the inductor are inexpensive are significantly less expensive than a comparable external inductor that would normally be electrically coupled to the integrated circuit via a circuit board.

Although certain methods, systems, and articles of manufacture have been described herein, the scope of coverage of this patent is not limited thereto. To the contrary, this patent covers all methods, systems, and articles of manufacture fairly falling within the scope of the appended claims either literally or under the doctrine of equivalents.

What is claimed is:

1. A packaged integrated circuit having an inductor, comprising:
   a substrate having a first trace and a second trace;
   an integrated circuit attached to the substrate over the first trace and the second trace; and
   an electrical conductor coupling the first trace to the second trace and extending over the integrated circuit to form the inductor in the packaged integrated circuit.

2. A packaged integrated circuit as defined in claim 1, wherein the electrical conductor comprises one or more bond wires.

3. A packaged integrated circuit as defined in claim 2, wherein more than one bond wires are coupled to one contact on the integrated circuit.

4. A packaged integrated circuit as defined in claim 1, further comprising a second electrical conductor to electrically couple the integrated circuit to the first trace.

5. A packaged integrated circuit as defined in claim 4, further comprising a third electrical conductor to electrically couple the integrated circuit to the second trace.

6. A packaged integrated circuit as defined in claim 4, further comprising a via to electrically couple the second trace to a conductive element on a surface of the packaged integrated circuit.

7. A packaged integrated circuit as defined in claim 1, wherein the electrical conductor comprises:
   a first bond wire electrically coupling the first trace to the second trace; and
   a second bond wire electrically coupling the first trace to the second trace.

8. A packaged integrated circuit as in claim 1, wherein the electrical conductor encompasses a first side surface, a top surface and a second side surface of the integrated circuit.

9. An electronic device, comprising:
   a circuit board; and
   a packaged integrated circuit attached to the circuit board, the packaged integrated circuit having a substrate having a first trace and a second trace, an integrated circuit attached to the substrate over the first trace and the second trace, and an electrical conductor coupling the first trace to the second trace and extending over the integrated circuit to form an inductor in the packaged integrated circuit.

10. An electronic device as defined in claim 9, wherein the electrical conductor comprises one or more bond wires.

11. An electronic device as defined in claim 10, wherein the one or more bond wires are coupled to one or more contacts on the integrated circuit.

12. An electronic device as defined in claim 9, wherein the electrical conductor encompasses a first side surface, a top surface and a second side surface of the integrated circuit.

13. An electronic device as defined in claim 9, wherein the electrical conductor comprises:
   a trace on the integrated circuit;
   a first bond wire to electrically couple the first trace to the trace on the integrated circuit; and
   a second bond wire to electrically couple the trace on the integrated circuit to the second trace.

14. An electronic device as defined in claim 9, further comprising a second electrical conductor to electrically couple the integrated circuit to the first trace.

15. An electronic device as defined in claim 14, further comprising a third electrical conductor to electrically couple the second trace to the integrated circuit.

16. An electronic device as defined in claim 14, further comprising a via to electrically couple the second trace to a conductive element on a surface of the packaged integrated circuit.

17. A packaged integrated circuit, comprising:
   a substrate having a first trace and a second trace;
   an integrated circuit attached to the substrate over the first trace and the second trace; and
   an electrical conductor electrically coupling a first contact on the first trace to a first contact on the second trace, said electrical conductor extending over the integrated circuit to form an inductor in the packaged integrated circuit.

18. A packaged integrated circuit as in claim 17, wherein a second contact on the first trace is electrically coupled to a contact on the integrated circuit.

19. A packaged integrated circuit as in claim 18, wherein a second contact on the second trace is electrically coupled to a second contact on the integrated circuit.

20. A package integrated circuit as in claim 17, further including:
   a third trace on the substrate and beneath the integrated circuit;
   a second electrical conductor electrically coupling a second contact on the second trace to a first contact on the third trace.

21. A packaged integrated circuit as in claim 20, wherein a second contact on the first trace is electrically coupled to a contact on the integrated circuit.

22. A packaged integrated circuit as in claim 21, wherein the second contact on the third trace is electrically coupled to a second contact on the integrated circuit.

23. A packaged integrated circuit as in claim 17, wherein the electrical conductor comprises a bond wire.

24. A packaged integrated circuit as in claim 17, wherein the electrical conductor comprises two parallel bond wires.

25. A packaged integrated circuit as in claim 17, wherein the electrical conductor comprises a first bond wire coupling the first contact on the first trace to a first contact on the integrated circuit, a second bond wire coupling the first contact on the integrated circuit to a second contact on the integrated circuit, and a third bond wire coupling the second contact on the integrated circuit to the first contact on the second trace.

26. A packaged integrated circuit as in claim 25, wherein the first and second contacts on the integrated circuit are not electrically coupled to circuitry within the integrated circuit.

27. A packaged integrated circuit as in claim 17, further comprising an insulator spaced between the electrical conductor and the integrated circuit.

28. A packaged integrated circuit as in claim 27, wherein the electrical conductor comprises a first bond wire coupling the first contact on the first trace to a first trace on a surface of the insulator opposite the integrated circuit, a second bond wire coupling the first trace on the surface of the insulator opposite the integrated circuit to the first contact on the second trace.

29. A packaged integrated circuit as in claim 17, wherein a combination of the first trace, the second trace and the electrical conductor encircles the integrated circuit.

30. A packaged integrated circuit as in claim 17, wherein the electrical conductor encompasses a first side surface, a top surface and a second side surface of the integrated circuit.

* * * * *